(12) United States Patent
Brown et al.

(10) Patent No.: US 10,685,696 B2
(45) Date of Patent: Jun. 16, 2020

(54) APPARATUSES AND METHODS FOR ACCESS BASED REFRESH TIMING

(71) Applicant: MICRON TECHNOLOGY, INC., Boise, ID (US)

(72) Inventors: Jason M. Brown, Wylie, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/176,932

(22) Filed: Oct. 31, 2018

(65) Prior Publication Data

US 2020/0135263 A1   Apr. 30, 2020

(51) Int. Cl.
| | |
|---|---|
| *G11C 7/00* | (2006.01) |
| *G11C 11/406* | (2006.01) |
| *G11C 16/34* | (2006.01) |
| *G11C 7/10* | (2006.01) |
| *G06F 11/30* | (2006.01) |
| *G11C 11/4076* | (2006.01) |

(52) U.S. Cl.
CPC .... *G11C 11/40611* (2013.01); *G06F 11/3037* (2013.01); *G11C 7/1039* (2013.01); *G11C 11/4076* (2013.01); *G11C 16/349* (2013.01); *G11C 16/3431* (2013.01); *G06F 2201/88* (2013.01); *G11C 7/00* (2013.01); *G11C 2211/406* (2013.01)

(58) Field of Classification Search
CPC .................................................. G11C 7/00
USPC ........................................................ 365/222
See application file for complete search history.

(56) References Cited

U.S. PATENT DOCUMENTS

| | | | |
|---|---|---|---|
| 5,299,159 | A | 3/1994 | Balistreri et al. |
| 5,943,283 | A | 8/1999 | Wong et al. |
| 5,970,507 | A | 10/1999 | Kato et al. |
| 5,999,471 | A | 12/1999 | Choi |
| 6,002,629 | A | 12/1999 | Kim et al. |

(Continued)

FOREIGN PATENT DOCUMENTS

| | | |
|---|---|---|
| CN | 104350546 A | 2/2015 |
| CN | 106710621 A | 5/2017 |

(Continued)

OTHER PUBLICATIONS

U.S. Appl. No. 16/025,844, titled "Apparatus and Methods for Triggering Row Hammer Address Sampling", filed Jul. 2, 2018.

(Continued)

*Primary Examiner* — Jason Lappas
(74) *Attorney, Agent, or Firm* — Dorsey & Whitney LLP

(57) ABSTRACT

Embodiments of the disclosure are drawn to apparatuses and methods for scheduling targeted refreshes in a memory device. Memory cells in a memory device may be volatile and may need to be periodically refreshed as part of an auto-refresh operation. In addition, certain rows may experience faster degradation, and may need to undergo targeted refresh operations, where a specific targeted refresh address is provided and refreshed. The rate at which targeted refresh operations need to occur may be based on the rate at which memory cells are accessed. The memory device may monitor accesses to a bank of the memory, and may use a count of the accesses to determine if an auto-refresh address or a targeted refresh address will be refreshed.

7 Claims, 7 Drawing Sheets

(56) References Cited

U.S. PATENT DOCUMENTS

| | | |
|---|---|---|
| 6,392,952 B1 | 5/2002 | Chen et al. |
| 7,082,070 B2 | 7/2006 | Hong |
| 7,203,113 B2 | 4/2007 | Takahashi et al. |
| 7,830,742 B2 | 11/2010 | Han |
| 8,174,921 B2 | 5/2012 | Kim et al. |
| 8,400,805 B2 | 3/2013 | Yoko |
| 8,625,360 B2 | 1/2014 | Iwamoto et al. |
| 8,811,100 B2 | 8/2014 | Ku |
| 9,032,141 B2 | 5/2015 | Bains et al. |
| 9,117,544 B2 | 8/2015 | Bains et al. |
| 9,236,110 B2 | 1/2016 | Bains et al. |
| 9,251,885 B2 | 2/2016 | Greenfield et al. |
| 9,299,400 B2 | 3/2016 | Bains et al. |
| 9,734,887 B1 | 8/2017 | Tavva |
| 9,761,297 B1 | 9/2017 | Tomishima |
| 9,805,783 B2 | 10/2017 | Ito et al. |
| 9,818,469 B1 | 11/2017 | Kim et al. |
| 9,865,328 B1 | 1/2018 | Desimone et al. |
| 10,032,501 B2 | 7/2018 | Ito et al. |
| 10,090,038 B2 | 10/2018 | Shin |
| 10,381,327 B2 | 8/2019 | Ramachandra et al. |
| 2002/0026613 A1 | 2/2002 | Niiro |
| 2003/0231540 A1 | 12/2003 | Lazar et al. |
| 2004/0130959 A1 | 7/2004 | Kawaguchi |
| 2005/0265104 A1* | 12/2005 | Remaklus, Jr. ..... G06F 13/1636 365/222 |
| 2007/0028068 A1 | 2/2007 | Golding et al. |
| 2008/0181048 A1 | 7/2008 | Han |
| 2008/0224742 A1 | 9/2008 | Pomichter |
| 2009/0021999 A1 | 1/2009 | Tanimura et al. |
| 2009/0059641 A1 | 3/2009 | Jeddeloh |
| 2009/0168571 A1 | 7/2009 | Pyo et al. |
| 2010/0005376 A1 | 1/2010 | Laberge et al. |
| 2010/0182863 A1 | 7/2010 | Fukiage |
| 2010/0329069 A1 | 12/2010 | Ito et al. |
| 2011/0055495 A1 | 3/2011 | Remaklus, Jr. et al. |
| 2011/0225355 A1 | 9/2011 | Kajigaya |
| 2011/0310648 A1 | 12/2011 | Iwamoto et al. |
| 2012/0254472 A1 | 10/2012 | Ware et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0177370 A1 | 6/2014 | Halbert et al. |
| 2014/0189228 A1 | 7/2014 | Greenfield et al. |
| 2014/0237307 A1 | 8/2014 | Kobla et al. |
| 2014/0241099 A1 | 8/2014 | Seo et al. |
| 2014/0281206 A1 | 9/2014 | Crawford et al. |
| 2015/0078112 A1 | 3/2015 | Huang |
| 2015/0089326 A1 | 3/2015 | Joo et al. |
| 2015/0109871 A1 | 4/2015 | Bains et al. |
| 2015/0255140 A1 | 9/2015 | Song |
| 2015/0356048 A1 | 12/2015 | King |
| 2016/0027498 A1 | 1/2016 | Ware et al. |
| 2016/0180921 A1 | 6/2016 | Jeong |
| 2016/0196863 A1 | 7/2016 | Shin et al. |
| 2016/0225433 A1 | 8/2016 | Bains et al. |
| 2016/0343423 A1 | 11/2016 | Shido |
| 2017/0076779 A1 | 3/2017 | Bains et al. |
| 2017/0092350 A1 | 3/2017 | Halbert et al. |
| 2017/0133085 A1 | 5/2017 | Kim et al. |
| 2017/0140807 A1 | 5/2017 | Sun et al. |
| 2017/0148504 A1 | 5/2017 | Saifuddin et al. |
| 2017/0186481 A1 | 6/2017 | Oh et al. |
| 2017/0213586 A1 | 7/2017 | Kang et al. |
| 2017/0287547 A1 | 10/2017 | Ito et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0096719 A1 | 4/2018 | Tomishima et al. |
| 2018/0114561 A1 | 4/2018 | Fisch et al. |
| 2018/0114565 A1 | 4/2018 | Lee |
| 2018/0218767 A1 | 8/2018 | Wolff |
| 2018/0254078 A1 | 9/2018 | We et al. |
| 2018/0261268 A1 | 9/2018 | Hyun et al. |
| 2018/0294028 A1 | 10/2018 | Lee et al. |
| 2019/0043558 A1 | 2/2019 | Suh et al. |
| 2019/0088315 A1 | 3/2019 | Saenz et al. |
| 2019/0088316 A1 | 3/2019 | Inuzuka et al. |
| 2019/0161341 A1 | 5/2019 | Howe |
| 2019/0196730 A1 | 6/2019 | Imran |
| 2019/0205253 A1 | 7/2019 | Roberts |
| 2019/0228815 A1 | 7/2019 | Morohashi et al. |
| 2019/0252020 A1 | 8/2019 | Rios et al. |
| 2019/0279706 A1 | 9/2019 | Kim |
| 2019/0362774 A1 | 11/2019 | Kuramori et al. |
| 2019/0385661 A1 | 12/2019 | Koo et al. |

FOREIGN PATENT DOCUMENTS

| | | |
|---|---|---|
| CN | 107871516 A | 4/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| WO | 2017171927 A1 | 10/2017 |

OTHER PUBLICATIONS

U.S. Appl. No. 16/084,119, titled "Apparatuses and Methods for Pure-Time, Self Adopt Sampling for Row Hammer Refresh Sampling", filed Sep. 11, 2018.

U.S. Appl. No. 16/230,300, titled "Apparatuses and Methods for Staggered Timing of Targeted Refresh Operations" filed Dec. 21, 2018.

U.S. Appl. No. 16/232,837, titled "Apparatuses and Methods for Distributed Targeted Refresh Operations", filed Dec. 26, 2018.

U.S. Appl. No. 16/286,187 titled "Apparatuses and Methods for Memory Mat Refresh Sequencing" filed Feb. 26, 2019.

U.S. Appl. No. 16/290,730, titled "Semiconductor Device Performing Row Hammer Refresh Operation", filed Mar. 1, 2019.

U.S. Appl. No. 16/374,623, titled "Semiconductor Device Performing Row Hammer Refresh Operation", filed Apr. 3, 2019.

U.S. Appl. No. 16/375,716 titled "Stagger RHR Pumping Scheme Across Die Banks" filed Apr. 4, 2019; pp. all.

U.S. Appl. No. 16/431,641 titled "Apparatuses and Methods for Controlling Steal Rates" filed Jun. 4, 2019.

U.S. Appl. No. 16/012,679, titled "Apparatuses and Methods for Multiple Row Hammer Refresh Address Sequences", filed Jun. 19, 2018.

U.S. Appl. No. 16/020,863, titled "Semiconductor Device", filed Jun. 27, 2018.

Kim, et al., "Flipping Bits in MemoryWithout Accessing Them; An Experimental Study of DRAM Disturbance Errors", IEEE, Jun. 2014, 12 pgs.

U.S. Appl. No. 16/537,981 titled "Apparatuses and Methods for Controlling Targeted Refresh Rates" filed Aug. 12, 2019.

U.S. Appl. No. 16/682,606, titled "Apparatuses and Methods for Distributing Row Hammer Refresh Events Across a Memory Device", filed Nov. 13, 2019.

U.S. Appl. No. 16/655,110 titled "Apparatuses and Methods for Dynamic Targeted Refresh Steals" filed Oct. 16, 2019.

U.S. Appl. No. 16/549,411 titled "Apparatuses and Methods for Dynamic Refresh Allocation" filed Aug. 23, 2019.

U.S. Appl. No. 16/788,657, titled "Semiconductor Device Performing Row Hammer Refresh Operation", dated Feb. 12, 2020.

U.S. Appl. No. 16/818,989, titled "Semiconductor Device Performing Row Hammer Refresh Operation", dated Mar. 13, 2020.

U.S. Appl. No. 16/818,981 titled "Apparatuses and Methods for Staggered Timing of Targeted Refresh Operations" filed Mar. 13, 2020.

U.S. Appl. No. 16/805,197, titled "Apparatuses and Methods for Calculating Row Hammer Refresh Addresses in a Semiconductor Device", dated Feb. 28, 2020.

(56) References Cited

OTHER PUBLICATIONS

U.S. Appl. No. 16/824,460, titled "Semiconductor Device Performing Row Hammer Refresh Operation", dated Mar. 19, 2020.

* cited by examiner

APPARATUSES AND METHODS FOR ACCESS BASED REFRESH TIMING

BACKGROUND

This disclosure relates generally to semiconductor devices, and more specifically to semiconductor memory devices. In particular, the disclosure relates to volatile memory, such as dynamic random access memory (DRAM). Information may be stored in memory cells of the DRAM as a changed physical property of the memory cell. For example the memory cell may be a capacitive element, and the information may be stored as the charge of the capacitive element. The DRAM may include volatile memory cells, which are memory cells where the physical property may change over time (e.g., the charge on a capacitor may decay over time) which may, in turn, degrade the data stored in the memory cell over time. Thus, it may be necessary to periodically refresh the memory cells to maintain information fidelity in the memory (e.g., by restoring the memory cell to an initial charge level).

As memory components have decreased in size, the density of memory cells has greatly increased. Repeated access to a particular memory cell, or group of memory cells (often referred to as a 'row hammer') may cause an increased rate of data degradation in nearby memory cells. It may be desirable to identify and refresh memory cells affected by the row hammer. These targeted refreshes may need to be interspersed amongst the regular periodic refreshes which are carried out on rows which are not experiencing a row hammer effect.

DETAILED DESCRIPTION

Figure 1:
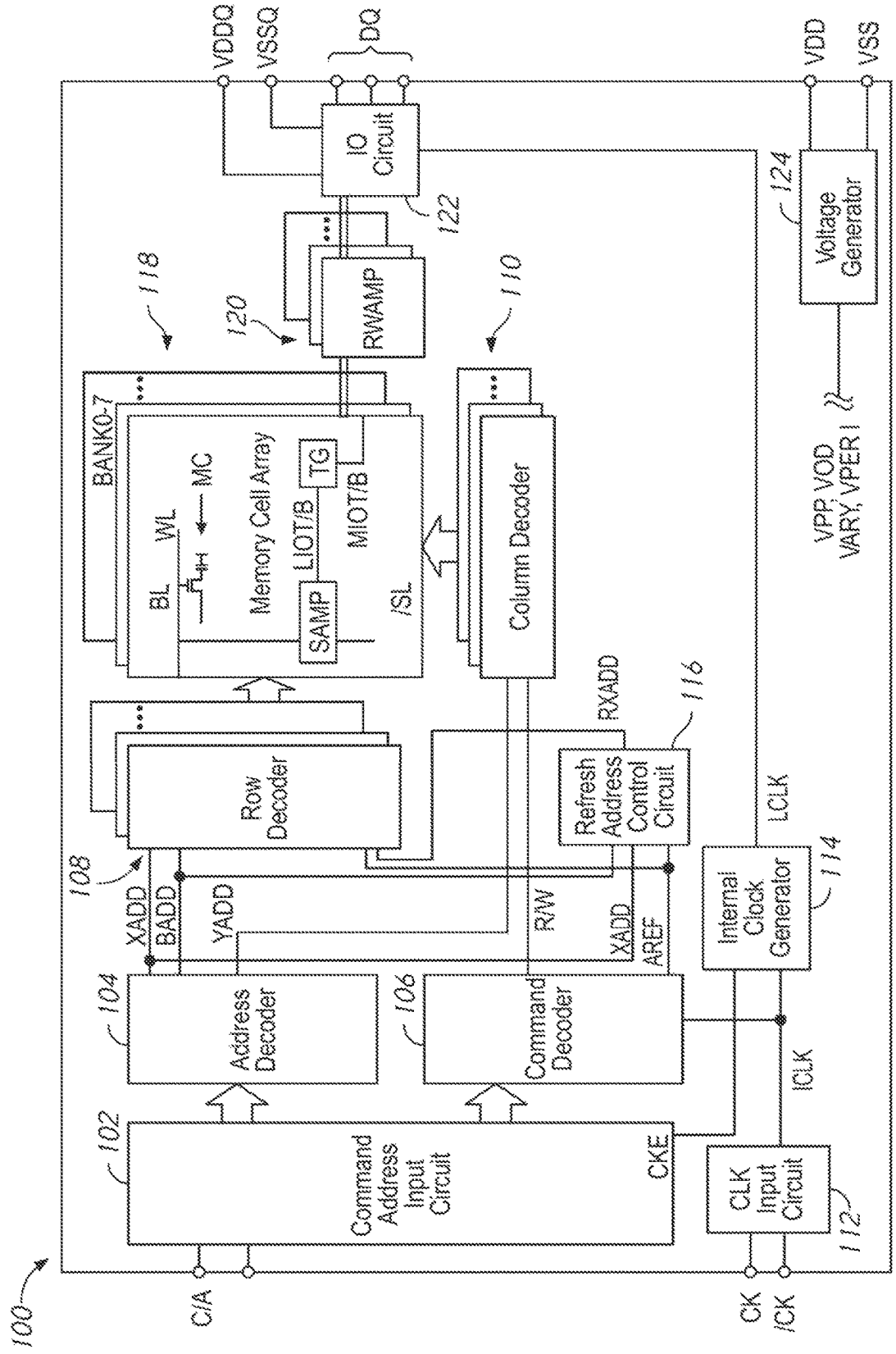
FIG. 1 is a block diagram showing an overall configuration of a semiconductor device according to at least one embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A semiconductor memory device may store information in a plurality of memory cells, each of which is disposed at the intersection of a particular row (word line) and column (bit line). The memory cells may store information in a manner which is volatile, such that the state of the memory cell (and thus the information stored therein) changes or decays over time. Accordingly, memory devices may conduct refresh operations in which the state of the memory cell is restored to an initial value (e.g., an initial level of charge) corresponding to the information stored in that memory cell. For example, the information may be read from a given memory cell and then written back to the same memory cell. The refresh operation may refresh an entire row of memory cells at a time. These refreshes may be part of an auto-refresh operation and may happen as a result of user commands and/or may happen periodically. During an auto-refresh the memory device may work its way through a sequence of rows of memory cells of the semiconductor device In addition to the auto-refresh operation, it may be necessary to refresh certain targeted rows of memory cells. These rows may undergo degradation more quickly than other rows of the semiconductor device. Accordingly they may need to be refreshed more often than they would be by an auto-refresh operation. These targeted refresh rows (or targeted refresh addresses) may need to be identified and then targeted refreshes may need to be carried out while other refresh operations are occurring. The targeted refresh rows may be subject to the row hammer effect, in which repeated access to a given row (the aggressor row) causes degradation of one or more rows proximate to the aggressor row (the victim rows). The victim row(s) may be identified and provided as the targeted refresh rows. The rate at which the victim rows experience degradation may be related to the number (and/or rate) of accesses to the aggressor row. Accordingly, the rate at which targeted refresh operations need to be carried out may be dependent on the number and/or rate of accesses.

The present disclosure is aimed at apparatuses and methods for scheduling targeted refreshes. The memory device may carry out refresh operations on a sequence of row addresses, which may be timed based on an auto-refresh signal. The memory device may include a counter which checks to see if the number (and/or rate) of accesses to a particular memory location or memory locations of the memory device exceeds a threshold. If it does, the memory device may schedule a targeted row refresh, which may 'steal' one of the timing slots that would have been used for an auto-refresh address. If the accesses to a particular memory locations are not above the threshold, then the targeted refresh may be skipped, and the auto-refresh addresses may continue. The memory device may periodically check the counter to determine if a targeted refresh address will be provided or not. In this manner, the targeted refreshes may be scheduled based on an access count of the memory device.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The access commands by be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122. The external terminals DQ include several separate terminals, each providing a bit of data synchronized with a clock edge of a data clock of the device 100. The number of external terminals DQ corresponds a data width, that is, a number of bits of data concurrently provided with a clock edge of the data clocks. In some embodiments of the disclosure, the data width of the semiconductor device 100 is 8 bits. In other embodiments of the disclosure, the data width of the semiconductor device 100 is 16 bits, with the 16 bits separated into a lower byte of data (including 8 bits) and a upper byte of data (including 8 bits).

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. As previously described, the external terminals DQ include several separate terminals. With reference to a write operation, each external terminal DQ receives a bit of data, and the number of external terminals DQ corresponds to a data width of bits of data that are concurrently received synchronized to one or more clock signals. Some embodiments of the disclosure include a data width of 8 bits. In other embodiments of the disclosure, the data width is 16 bits, with the 16 bits separated into a lower byte of 8 bits of data and a upper byte of 8 bits of data.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh the predetermined word line WL contained in the memory cell array 118. The refresh address control circuit 116 may control a timing of a refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively output a targeted refresh address or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. The refresh address control circuit 116 may also determine targeted refresh addresses which are addresses that require refreshing based on the access pattern of nearby addresses in the memory array 118. The refresh address control circuit 116 may selectively use one or more signals of the device 100 to calculate the targeted refresh address RXADD. For example, the refresh address RXADD may be a calculated based on the row addresses XADD provided by the address decoder.

The refresh address control circuit 116 may determine whether to issue an auto-refresh address or a targeted refresh address as the refresh address RXADD based on monitoring access commands which are issued to the memory array 118. The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

The refresh address control circuit 116 may determine whether the provided refresh address RXADD is a targeted refresh address or an auto-refresh address based on monitoring the access commands to the memory array 118. In particular, the refresh address control circuit 116 may monitor the access commands which are issued to each bank of the memory array 116. The refresh address control circuit 116 is shown as coupled to the bank address BADD, however any signal (or other method) may be used to monitor the accesses to a particular bank (e.g., the refresh address control circuit 116 may monitor how often a particular bank is activated). The refresh address control circuit 116 may count a number (and/or rate) of activations to a given bank, and may compare that value to a threshold. The threshold may be a programmable value of device 100 (e.g., based on a fuse setting of the refresh address control circuit 116 and/or a value stored in a mode register of the device 100). When the number (and/or rate) of accesses to a given bank exceed the threshold, it may indicate that the bank is more likely to contain an address which is an aggressor address (e.g., due to the row hammer effect), and the refresh address control circuit 116 may provide a targeted refresh address. The refresh address control circuit 116 may provide the targeted refresh address right away, or may queue up the targeted refresh address to be provided at a later time (e.g., in the next time slot available for a targeted refresh).

The targeted refresh address may be based on characteristics over time of the row addresses XADD received from the address decoder 104. The refresh address control circuit 116 may sample the current row address XADD to determine its characteristics over time. The sampling may occur intermittently, with each sample acquired based on a random or pseudo-random timing. The refresh address control circuit 116 may use different methods to calculate a targeted refresh address based on the sampled row address XADD. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided.

The auto-refresh address may be provided by the refresh address control circuit 116 in order to periodically refresh the word lines of the memory array 118. The refresh address control circuit 116 may produce auto-refresh addresses in a sequence such that each time an auto-refresh address is provided as the refresh address RXADD, it is a next address in the sequence of auto-refresh addresses.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
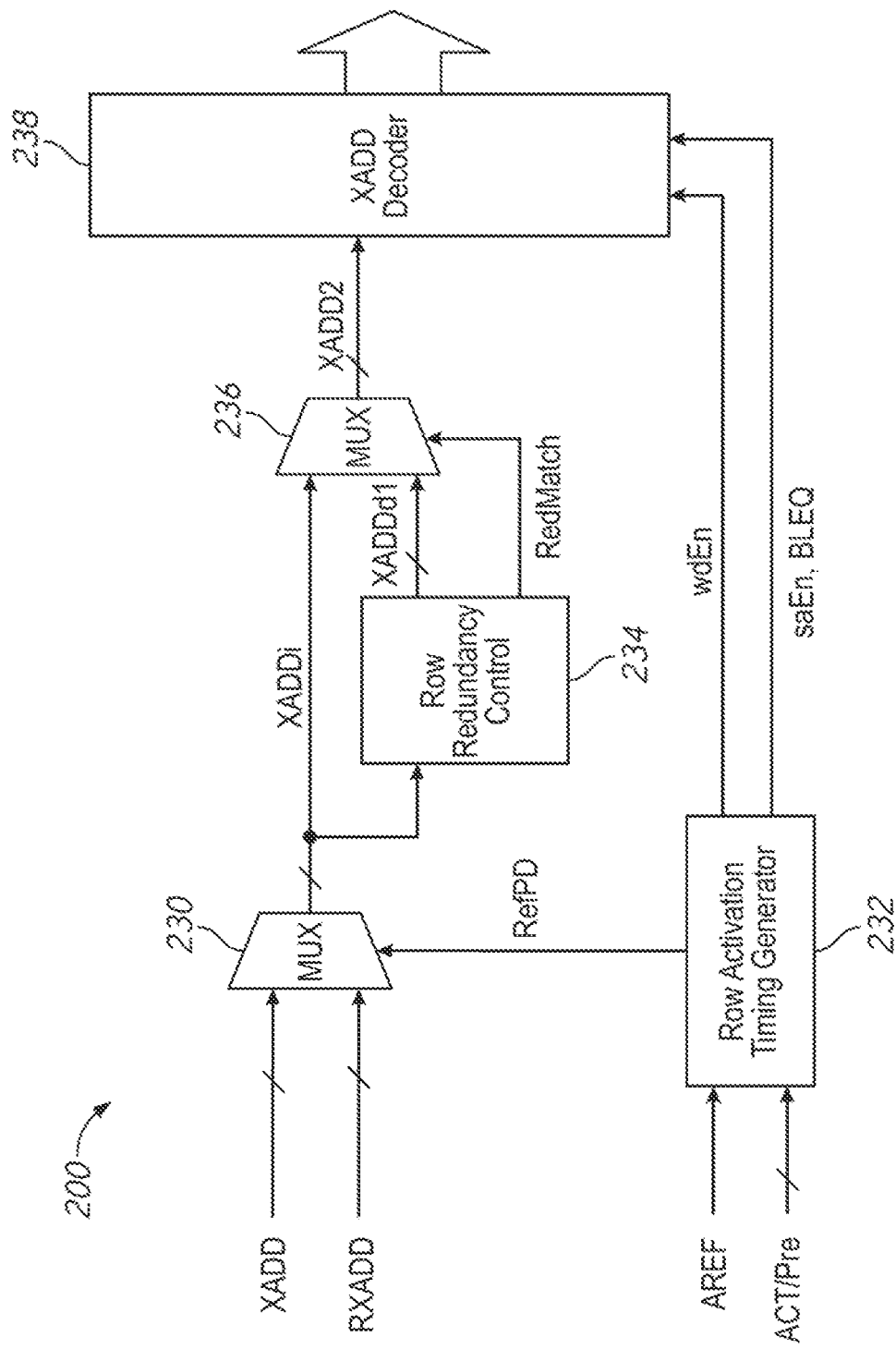
FIG. 2 is a block diagram of a row decoder according to an embodiment of the present disclosure.

FIG. 2 is a block diagram of a row decoder 200 according to an embodiment of the present disclosure. The row decoder 200 may be included in the row decoder 108 of FIG. 1 in some embodiments of the disclosure. The row decoder 200 may determine whether to activate a word line of the memory bank (e.g., a bank of memory array 118 of FIG. 1) corresponding to the row address XADD or the refresh address RXADD.

As shown in FIG. 2, the row decoder 200 is provided with a row activation timing generator 232, which receives the refresh signal AREF, the active signal ACT, and the precharge signal Pre and provides a state signal RefPD, a word-line actuation signal wdEn, a sense-amplifier actuation signal saEn, and a bit-line equalize signal BLEQ. The state signal RefPD is supplied to a multiplexer 230, which selects one of the row address XADD and the refresh address RXADD. An address XADDi selected by the multiplexer 230 is supplied to a row redundancy control circuit 234. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 236; wherein, if the hit signal RedMatch is not activated, the address XADDi is selected; and, if the hit signal RedMatch is activated, the address XADDd1 is selected. The selected address XADD2 is supplied to an X address decoder 238. The X address decoder 238 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Figure 3A:
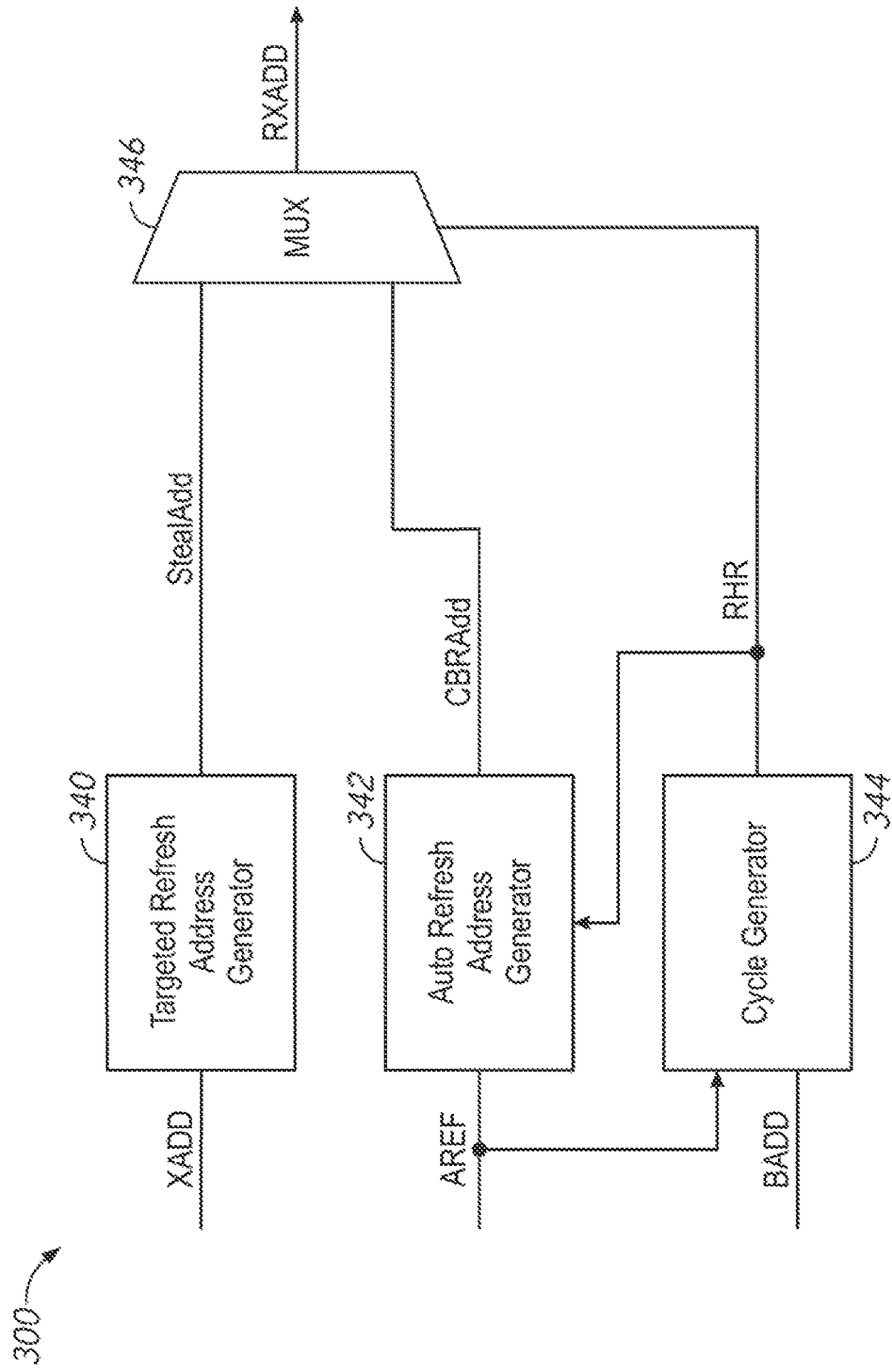
FIGS. 3A-3B are block diagrams depicting a refresh address control circuit and cycle generator according to an embodiment of the present disclosure.
Figure 3B:
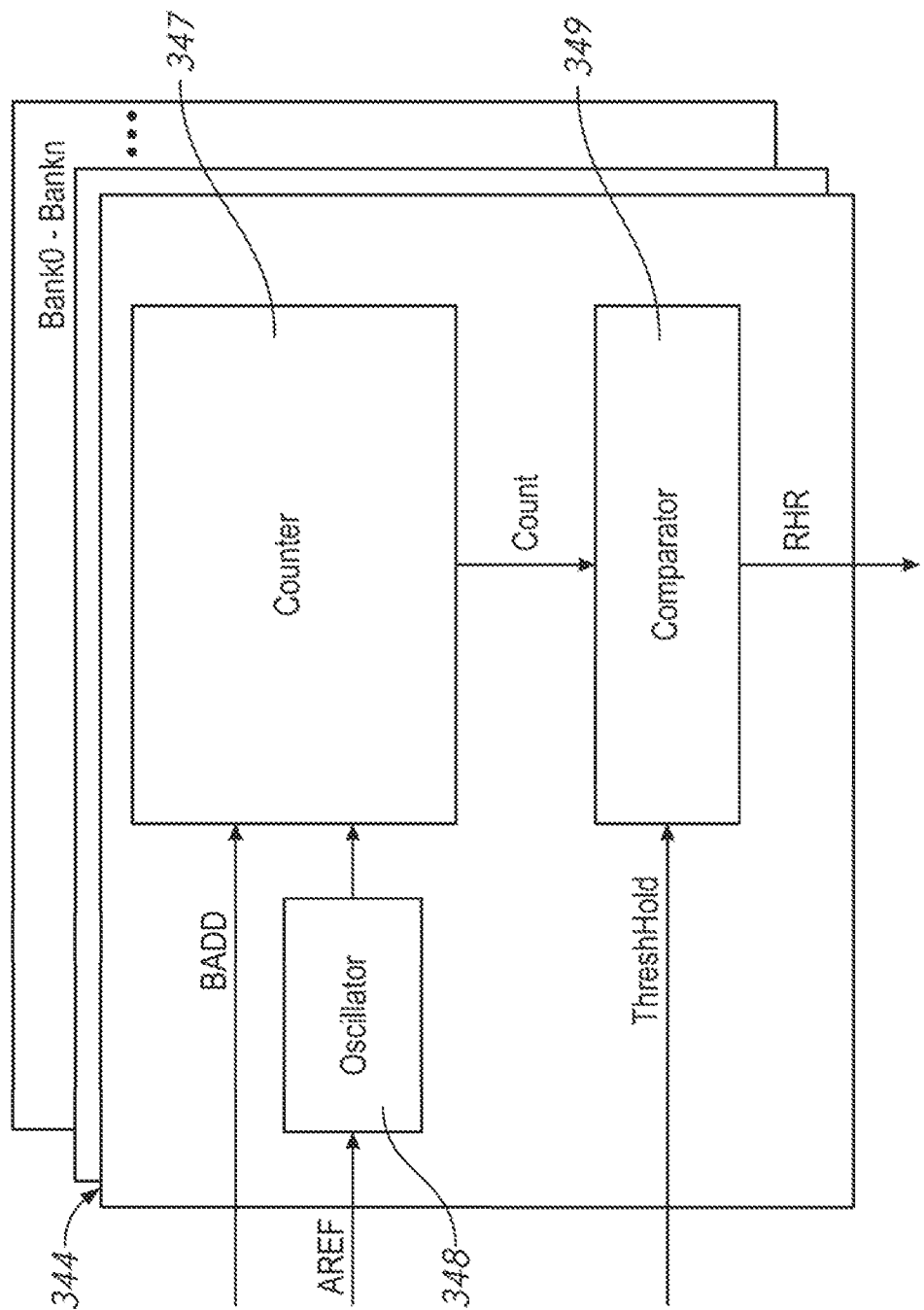

FIGS. 3A-3B are a block diagrams depicting a refresh address control circuit and cycle generator according to an embodiment of the present disclosure. The refresh address control circuit 300 of FIG. 3A may be used as an implementation of the refresh address control circuit 116 of FIG. 1 in some embodiments. The refresh address control circuit 300 may receive a row address XADD, an auto-refresh signal AREF, and a bank address signal BADD, and may provide the refresh address RXADD. The refresh address control circuit 300 may selectively provide either a targeted refresh address StealAdd or an auto-refresh address CBRAdd as the refresh address RXADD. The targeted refresh address may also be referred to as a 'steal address' since in some embodiments it may steal a time slot which would otherwise be assigned to an auto-refresh address. The auto-refresh address may also be referred to as a column address select (CAS) before row address select (RAS) (CAS before RAS or CBR) address.

The refresh address control circuit 300 includes a targeted refresh address generator 340, which receives the row address XADD and provides the targeted refresh address StealAdd. The circuit 300 also includes an auto-refresh address generator 342 and a cycle generator 344. An example implementation of the cycle generator 344 is shown in more detail in FIG. 3B. The auto-refresh address generator 342 receives an auto-refresh signal AREF and a targeted refresh signal RHR and provides the auto-refresh address CBRAdd. The cycle generator 344 may receive the auto-refresh signal AREF and the bank address BADD, and may provide the targeted refresh signal RHR in response. The targeted refresh signal RHR may be provided to indicate that a targeted row refresh should be carried out by providing the targeted refresh address StealAdd as the refresh address RXADD. The targeted refresh address StealAdd and auto-refresh address CBRAdd are both provided to a multiplexer 346 as inputs. The multiplexer provides one of these addresses as the refresh address RXADD based on the state of the targeted refresh signal RHR.

Although certain signals (XADD, AREF, BADD) are shown coupled to the components of the refresh address control circuit 300, it is to be understood that more or fewer, or different, signals may be used in other examples. For example, the cycle generator 344 may use signals other than (or in addition to) the bank address BADD to determine access to a given bank.

The targeted refresh address generator 340 identifies one or more target addresses StealAdd which require a targeted refresh. The targeted refresh address generator 340 may determine the row addresses for a targeted refresh in any number of ways. In an example embodiment, the targeted refresh address generator 340 may monitor the provided row addresses XADD to determine if one or more addresses is being hammered (e.g., accessed a certain number of times, faster than a given rate, etc.). The targeted refresh address generator 340 may then identify the addresses which are the victim rows on either side of the aggressor row (e.g., the rows which are physically adjacent to the hammered row). In this example embodiment, the targeted refresh address generator 340 may provide a first targeted refresh address StealAdd+1 and a second targeted refresh address StealAdd−1 corresponding to the addresses of the victim rows which are adjacent to the identified aggressor row. Other types of aggressor rows and other relationships between the victim rows and the aggressor rows may be used in other examples.

In some embodiments of the disclosure, the targeted refresh address generator 340 may determine a hammered aggressor row based on the number and/or frequency of accesses to a particular row. In some embodiments of the disclosure, the targeted refresh address generator 340 may sample incoming row addresses XADD at random (or semi-random) intervals, and the sampled row addresses may be compared to the previously sampled row addresses to determine if a given row address is being frequently accessed. Other methods of identifying hammered aggressor rows may be used in other example embodiments.

The targeted refresh address generator 340 provides one or more targeted refresh addresses StealAdd based on the row addresses XADD. In some embodiments the targeted refresh address generator 340 may provide a single targeted refresh address StealAdd. In some embodiments, the targeted refresh address generator 340 may provide a sequence of multiple targeted refresh addresses StealAdd over time. For example, as discussed above, the targeted refresh address generator 340 may provide a first and second targeted refresh address which correspond to the rows which are physically adjacent to a hammered row. As described in FIG. 4, these addresses may be provided sequentially by the targeted refresh address generator 340. Other relationships between the targeted rows and the identified hammered row may be used in other example embodiments.

The auto-refresh address generator 342 may provide a sequence of auto-refresh addresses responsive to an auto-refresh signal (e.g., AREF). The auto-refresh generator may sequentially move through a number of addresses in a memory bank. Each activation of the auto-refresh signal AREF may cause the auto-refresh address generator 342 to provide a next address in the sequence of addresses as the auto-refresh address CBRAdd. In some embodiments, the auto-refresh address generator 342 may provide multiple auto-refresh addresses CBRAdd with each activation of the auto-refresh signal AREF.

The auto-refresh generator 342 may be coupled to the targeted refresh signal RHR, which may indicate that a targeted refresh address StealAdd is going to be used as the refresh address RXADD. In some embodiments, the auto-refresh generator 342 may pause providing auto-refresh addresses CBRAdd while the targeted refresh signal RHR is active. Accordingly, when the targeted refresh signal RHR is no longer active, the auto-refresh address generator 342 may resume providing auto-refresh addresses at the same point in the sequence it was at before it received an active RHR signal.

The cycle generator 344 may determine the timing of whether the refresh address RXADD is an auto-refresh address or a targeted refresh address StealAdd based on the accesses (e.g., read and write commands) issued to a memory array (e.g., memory array 118 of FIG. 1). The cycle generator 344 monitors the accesses to each of the different banks of the memory device and determines when to signal that a targeted refresh address StealAdd should be provided as the refresh address RXADD to a given bank based on the monitored accesses. The cycle generator 344 may monitor a number of accesses to each of the banks and/or may monitor a rate at which each bank is being accessed. The accesses may be determined based on one or more signals provided to the refresh address control circuit 300. The cycle generator 344 may determine if the number of accesses is above a threshold number and/or if the rate of accesses is above a threshold rate.

As shown in more detail in FIG. 3B, the cycle generator 344 may include a counter circuit 347 which determines a number (or frequency) of accesses to a given bank, and a comparator circuit 349 which compares the value of the count stored in the counter circuit to a threshold number (or frequency). The counter circuit 347 may provide one or more signals Count to the comparator circuit 349 which indicates the value of a count associated with a bank. The threshold may be a predetermined property of the cycle generator 344 or may be a programmable value which may be provided as a signal ThreshHold. The comparator circuit 349 may provide the signal RHR when the comparator circuit 349 determines that the counter circuit has a value which is greater than the threshold.

In an example embodiment, the cycle generator 344 may be associated with a particular bank of the memory (e.g., Bank0, Bank1, . . . , Bankn). In some embodiments, the cycle generator 344 may be a component of the bank. Thus, for example, there may be multiple cycle generators 344 each associated with a respective bank of the memory array. Each cycle generator 344 may have a counter circuit 347 and a comparator circuit 349 which may monitor the accesses to the respective bank to which that the cycle generator 344 is associated.

The counter 347 may increment each time an access command is issued to that bank (e.g., as indicated by a bank address BADD). In some embodiments, the counters 347 may increment based on a specific combination of signals indicating one or more types of access commands. For example, the counter 347 for a given bank may increment when a bank address BADD and activate signal ACT are provided together, but may not increment when a bank address BADD and read/write signal R/W are provided together. When the counter 347 is equal to or greater than a threshold number of accesses, the cycle generator 344 may produce the signal RHR to indicate that the targeted refresh address StealAdd currently identified by the targeted refresh address generator 340 should be supplied as the refresh address RXADD. The counter 347 may be reset when a targeted refresh address is provided to a given bank.

In another example embodiment, rather than being associated with a particular bank, the counter circuit may include a plurality of counters, each associated with one of the banks. The comparator 349 may access particular counters in order to provide the signal RHR to a given one of the banks.

In some embodiments (for example, when rate is to be determined), the cycle generator 344 may include an oscillator 348, which may provide a timing signal to the counter 347. The oscillator may be synchronized to one or more signals of the device, such as the auto-refresh signal AREF. In some embodiments, the auto-refresh signal AREF may be used as the timing signal, and the oscillator 348 may not be needed to provide timing. The oscillator 348 may allow the value of the counter circuit 347 to reflect a rate rather than a raw number of accesses. The value of the counter circuit 347 may be compared to a threshold value which reflects a threshold rate.

In an example embodiment where rate is determined by the counter circuit 347, the oscillator 348 may act to produce a clock signal and provide it to the counter circuit 347. The counter circuit 347 may be periodically reset after a certain number of clock signals (e.g., after a certain amount of time). Accordingly, if the counter passes a threshold before being reset, it may indicate that the accesses are received at (or above) a certain threshold rate. In some embodiments, the clock signal may be synchronized to the auto-refresh signal AREF, or may be the auto-refresh signal AREF.

In another example embodiment where rate is determined by the counter circuit 347, the counter circuit 347 may decrement over time. The counter circuit 347 may increment when an access command is issued to that bank. The oscillator 348 may produce a clock signal. The counter circuit 347 may decrement responsive to the clock signal. The counter circuit 347 may thus only increase in value when access commands are received at a rate faster than the clock signal (e.g., when it is incrementing at a rate faster than it is decrementing). The value of the counter reaching a threshold value may be used to indicate that a rate of access commands is greater than a threshold rate determined by the clock signal.

Figure 4:
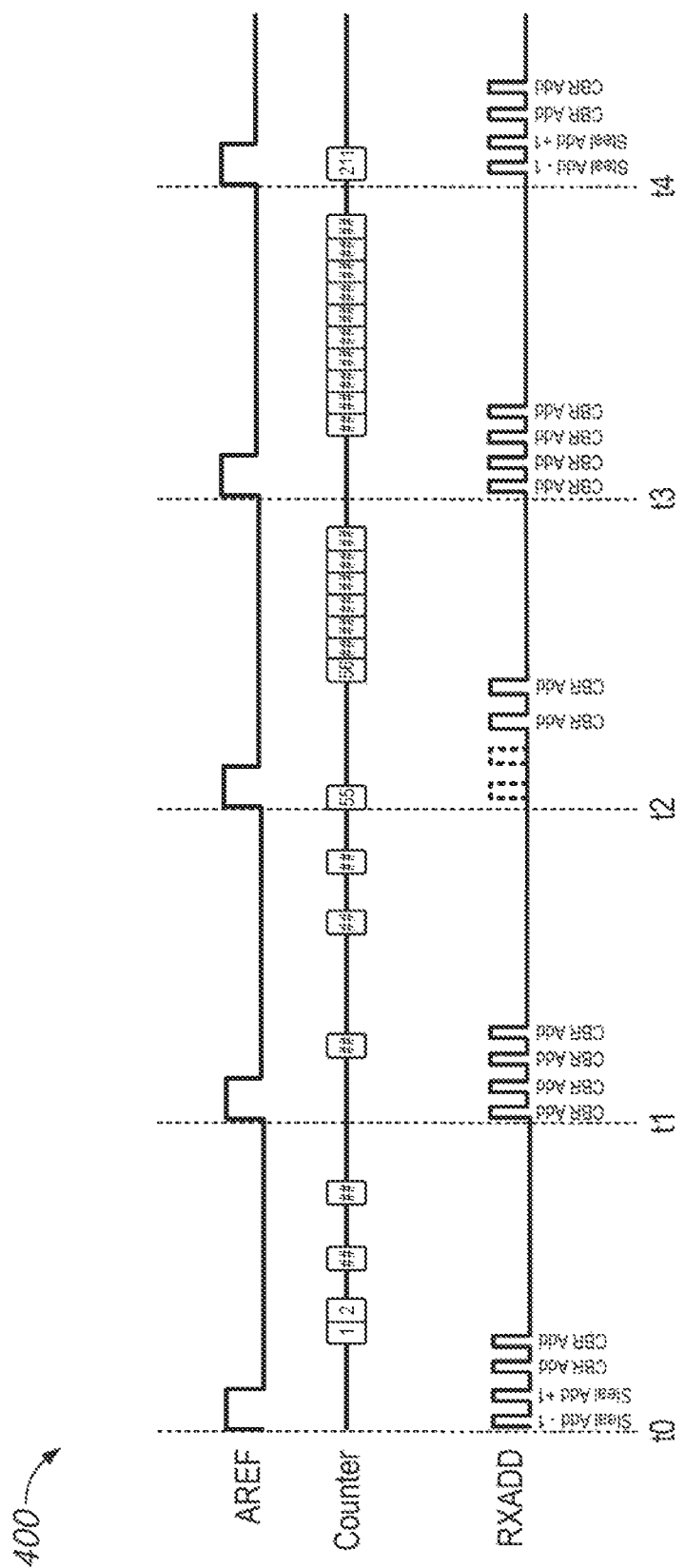
FIG. 4 is a timing diagram depicting operation of a refresh address circuit according to an embodiment of the present disclosure.

FIG. 4 is a timing diagram depicting operation of a refresh address circuit according to an embodiment of the present disclosure. The timing diagram 400 may depict the operation of a specific example circuit. In particular, the timing diagram 400 depicts an example embodiment where the number of accesses of a bank are counted and compared to a threshold. Other timing diagrams may correspond with the operation of other circuits of the present disclosure.

The first line of the timing diagram 400 depicts an auto-refresh signal AREF. The auto-refresh signal may be provided by a device which is external to the memory device (e.g., a memory controller). The auto-refresh signal AREF may periodically transition from a low logical level (e.g., a low voltage) to a high logical level (e.g., a high voltage) and then back to a low logical level. Each transition to a high logical level (a rising edge) may be counted as an activation of the auto-refresh signal AREF.

The second line of the timing diagram 400 shows a bank activation counter. The counter may have a value which increments each time an access command is issued to a given bank. The value of the bank activation counter may be periodically reset to 0 (e.g., after a targeted refresh is carried out). There may be a plurality of such counters, for example, each of the counters associated with a different bank of the memory device. For the sake of brevity, only a single bank activation counter is shown in the example timing diagram 400.

The third line of the timing diagram 400 shows the refresh addresses issued to a given memory bank. Similar to the bank activation counter, there may be a plurality of lines of refresh addresses each issued to a different one of the banks, however for clarity only a single line of refresh addresses is shown. The refresh addresses are represented here as pulsed signals rising from a low logic level to a high voltage level and then returning to a low voltage level. This may represent a time slot, or a period of time over which a given refresh address is provided. The actual addresses may be provided as electrical signals which convey the actual address, and which may have waveforms which are more complicated than the pulses depicted in the timing diagram 400. For example, the actual addresses may be provided as multi-bit signals, which may be transmitted in series on a single data line, and/or in parallel on multiple data lines. Each pulse is labeled with the address which is provided during that period. CBRAdd is used to represent an auto-refresh address. Each of the CBRAdd addresses shown in the timing diagram 400 may represent different wordlines of the memory which are being refreshed, even though for the sake of brevity they all share a common label. The targeted refresh addresses are represented as StealAdd−1 and StealAdd+1, which represents the addresses adjacent to an identified aggressor row. Similar to the auto-refresh addresses CBRAdd, even though they share a label, each pair of targeted refresh addresses StealAdd−1 and StealAdd+1 may correspond to different aggressor rows of the memory.

In the particular embodiment represented in the timing diagram 400, each auto-refresh signal AREF may cause the refresh address control circuit to provide up to four refresh addresses. The refresh address control circuit may be configured in the example device such that one quarter of the provided refresh addresses are targeted refresh addresses (e.g., the device has a steal rate of 1/4). For example, over two AREF activations, the refresh address control circuit may provide eight total refresh addresses. Six of these will be auto-refresh addresses CBRAdd, while two may be targeted refresh addresses StealAdd+1/−1.

At a first time t0, a targeted refresh operation occurs. At t0 AREF activates and rises from a low logic level to a high logic level. This causes the refresh address control circuit to provide four refresh addresses, two of which are targeted refresh addresses StealAdd−1 and StealAdd+1 and two of which are auto-refresh addresses CBRAdd. Since a targeted refresh operation was carried out, the bank activation counter is also reset to 0 (assume that the value was above the threshold prior to t0). After t0, the bank activation counter begins incrementing each time there is an access command issued to the corresponding bank. The counter may be responsive to any number of commands indicating access, such as an activation signal directed to a particular bank, a read/write command issued to a bank, a bank address, etc.

At t1, there is another activation of the AREF signal. The refresh address control circuit provides four auto-refresh addresses CBRAdd in four corresponding auto-refresh address time slots. Since there are no time slots allocated for targeted refresh addresses (since those only happen with every other AREF activation in this example embodiment), the value of the bank activation counter is not used to determine if targeted refresh addresses are provided. In some embodiments, the value of the counter may be compared to a threshold with the activation at t1, however the result may not be used. In some embodiments, the value of the counter may only be compared to the threshold when there is a possibility of a targeted refresh (e.g., at times t0, t2, etc. in the present example).

At t2, there is another activation of the AREF signal. This time the refresh address control circuit is configured to provide two auto-refresh addresses and two targeted refresh addresses due to the steal rate of the example device (for the two AREF signals at t1 and t2, there are eight total refresh addresses, two of which are allocated for targeted refresh addresses). The refresh address control circuit may provide the addresses in four time slots (set periods of time during which a refresh address can be provided). Two of the time slots may be auto-refresh address time slots and two may be targeted refresh address time slots. The refresh address control circuit may compare the value of the counter to a threshold value to determine if targeted refresh addresses are provided during the target refresh address time slots. In the example embodiment of the timing diagram 400, the threshold has been set to 200 activations. At t2, the bank activation counter has recorded 55 accesses, which is below the threshold value. Thus, at t2, the activation of AREF causes the refresh address control circuit to issue two auto-refresh addresses (one in each of the two auto-refresh time slots), but not any targeted refresh addresses as indicated by the dotted lines during the targeted refresh address time slots. In some embodiments, the refresh address control circuit may skip the targeted refresh addresses and may issue only the two auto-refresh addresses (e.g., the target refresh address time slots may pass with no refresh address provided in that time slot). In some embodiments, the refresh address control circuit may add in two additional auto-refresh addresses such that the same total number of refresh addresses are issued each time the auto-refresh signal activates (e.g., auto-refresh addresses may be provided during the target refresh address time slots).

At t3, there is another activation of AREF. Similar to the time t1, no targeted refresh addresses are issued or are scheduled to be issued at this activation. Accordingly, four auto-refresh addresses are issued in response to the AREF activation at t3.

At time t4, there is another activation of AREF. At this time, there are target refresh address time slots, so the value of the counter is compared to the threshold. At t4, the value of the bank activation counter is 211, which is above the threshold (e.g., 200) in this example embodiment. Thus, the refresh address control circuit provides two auto-refresh addresses CBRAdd during the auto-refresh address time slots, and two targeted refresh addresses StealAdd+1/−1 during the target refresh address time slots. Since targeted refresh addresses were provided, the counter will be reset back to 0.

Although a specific pattern of providing auto-refresh and targeted refresh addresses is discussed, it should be understood that any pattern of auto-refresh and targeted refresh addresses may be used. For example, the auto-refresh time slots may happen before the targeted refresh address time slots, or they may alternate. In another example, the device may be configured such that at each activation of the auto-refresh signal only a single refresh address is provided, which is an auto-refresh address unless the bank activation counter is above the threshold, in which case a targeted refresh address is provided instead. Thus, there may not be target refresh address time slots, and instead the refresh address control circuit may provide the targeted refresh addresses in time slots that would otherwise have been used for auto-refresh addresses.

Figure 5:
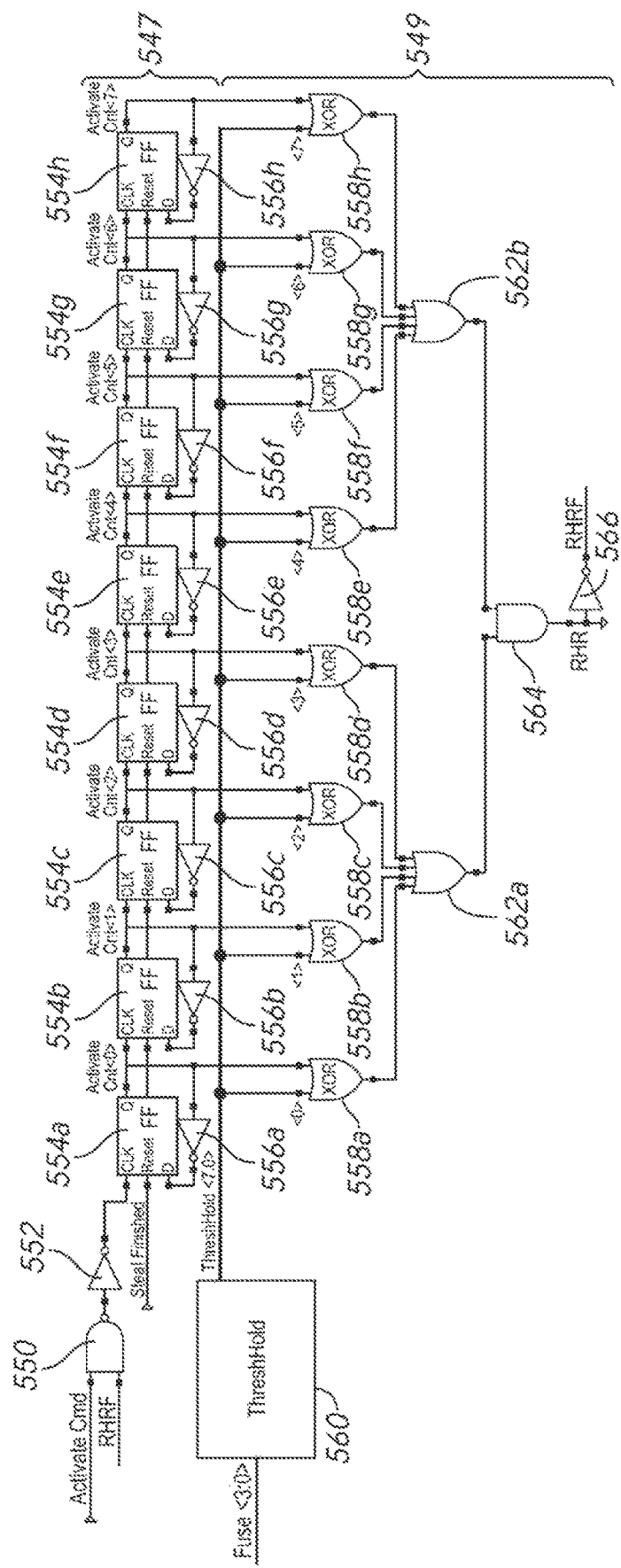
FIG. 5 is a schematic diagram of a cycle generator according to an embodiment of the present disclosure.

FIG. 5 is a schematic diagram of a cycle generator according to an embodiment of the present disclosure. The cycle generator 500 may be an implementation of the cycle generator 344 of FIG. 3 in some examples. The cycle generator 500 may be an implementation where there is a counter circuit 547 and comparator 549 for a single bank, and where the number of accesses to the bank is compared to a programmable threshold.

The cycle generator 500 may receive the bank activation commands ActivateCmd and provide the targeted refresh signal RHR. The targeted refresh signal RHR may be used as the signal RHR of FIG. 3 in some embodiments. The signal ActivateCmd may be any signal which indicates access to a particular bank and may be, for example, an activation signal sent to that bank, a read/write command, a bank address, etc. The cycle generator 500 may provide RHR to determine the timing of targeted refresh commands. In some embodiments, there may be a plurality of cycle generators 500, each coupled to a different memory bank of a memory device.

The cycle generator 500 includes a NAND logic gate 550 which receives ActivateCmd and RHRF, which may be the logical inverse of RHR. The output of the NAND gate 550 is provided to an inverter 552, which provides an output to the CLK terminal of a first flip-flop circuit 554. Each of the flip-flop circuits 554a-h is coupled in series such that the output terminal Q of a given flip-flop circuit (e.g., 554b) is coupled to the clock terminal of a next flip-flop circuit (e.g., 554c) in the series. The output terminal Q of each flip-flop circuit 554 is also coupled through a corresponding inverter 556 to the input terminal D. Each of the flip-flop circuits 554 has a reset terminal which is coupled in common to a line which carries a StealFinished signal.

Each flip-flop circuit 554a-h has an output terminal Q which is coupled to one input of an XOR gate 558a. The other terminal of the XOR gate 558a is coupled to a bit of a Threshold signal provided by a threshold generator 560. The threshold generator 560 receives a fuse signal to set a level of the threshold, and then provides the threshold signal Threshold, which comprises a number of different bits each of which have values corresponding to the set threshold. The XOR gates 558a-h provide outputs to NOR gates 562a, b. The XOR gates 558a-d are coupled to NOR gate 562a, and the XOR gates 558e-h are coupled to NOR gate 562b. The outputs of the NOR gates 562a-b are coupled to the inputs of an AND gate 564, which provides the signal RHR as an output. The signal RHR is coupled through an inverter 566 to provide the inverse signal RHRF, which is coupled to the NAND gate 550.

The cycle generator 500 includes a counter circuit 547 which includes the NAND gate 550, inverter 552, flip-flop circuits 554a-h and inverters 556a-h. The counter circuit 547 counts the number of ActivateCmd signals received by changing the states of the flip-flop circuits 554a-h. The cycle generator 500 also includes a comparator circuit 549 which includes the threshold generator 560, the XOR gates 558a-h, NOR gates 562a,b, and AND gate 564. The XOR gates 558a-h of the comparator circuit 549 compare the state of each corresponding flip-flop circuit 554a-h to a corresponding bit of the Threshold signal to determine if the count stored in the flip-flop circuits 554 has exceeded the threshold. If the count has exceeded the threshold, then the signal RHR is provided to signal that a targeted refresh should occur. The signal RHR is also inverted with inverter 566 and used as feedback to pause the operation of the counter circuit once the threshold has been met. Once the targeted refresh occurs, the signal StealFinished is provided to reset the state of the flip-flop circuits 554a-h (thus resetting RHRF to a high logic level), resetting the cycle generator 500.

The NAND gate 550 and the inverter 552 work together to only provide a signal to the first flip-flop circuit 554a of the counter circuit when an ActivateCmd is provided, but the signal RHR is not currently being provided. The NAND gate 550 returns a low logical level only when both inputs (e.g., ActivateCmd and RHRF) are at a high logical level. Taking into account the effects of the inverters 552 and 566, this means that a high logical level is only provided to the CLK terminal of the first flip-flop circuit 554a when ActivateCmd is at a high logical level and RHR is at a low logical level (RHRF at a high logical level). In this manner, the flip-flop circuits 554 may be prevented from responding to further activations of ActivateCmd, and may thus stop counting the accesses, while the signal RHR is active.

The counter circuit may act as a binary counter. Each time the ActivateCmd signal activates (assuming that RHR is in a low logical state), the states of the flip-flop circuits 554a-h may selectively change such that the state of each flip-flop circuit 554a-h represents a bit of a binary number which is the number of activations of the ActivateCmd signal (since the previous reset). As an example, before first activation of ActivateCmd, all the flip-flop circuits 554a-h may be reset (e.g., by an activation of StealFinished) such that they each are at a low logical level. At a first activation of the ActivateCmd, the first flip-flop circuit 554a is triggered to provide its stored value (a low logical level) at the terminal Q, which then feeds back through inverter 556a to the input D, which causes the state of the first flip-flop circuit 554a to change to a high logical level. At a second activation of ActivateCmd, the first flip-flop circuit 554a provides its stored value (a high logical level) to the second flip-flop circuit 554b, which provides a low logical level on its output Q, which due to feedback through inverter 558b causes the second flip-flop circuit to transition to a high logical level. The first flip-flop circuit 554a transitions to a low logical level due to providing a high logical level on the output Q. In this manner the flip-flop circuits 554 count the number of activations of the ActivateCmd in a binary fashion.

The threshold generator 560 provides the ThreshHold signal, which is a binary number representing the threshold, with each digit of the binary number supplied to a different one of the XOR gates 558a-h. In the example cycle generator 500, the ThreshHold signal may be an 8-bit number. Accordingly, there may be 8 shift registers 554a-h and 8 XOR gates 558a-h. The value of the threshold (and thus the number expressed by the ThreshHold signal) may be a programmable value. The threshold generator 560 may receive a Fuse signal which sets the value of the threshold by specifying the state of fuses within the threshold generator 560. In an example embodiment, the threshold generator 560 may have 16 different threshold levels which are set by the status of 4 different fuses. The Fuse signal may be a 4-bit signal which specifies the state of each of the fuses in the threshold generator 560.

The XOR gates 558a-h each compare the value of a digit of the ThreshHold signal to the value stored in a flip-flop circuit 554 corresponding to a digit of the count of ActivateCmd activations. Each XOR gate 558 returns a high logic level when the inputs of the logic gate are different, and a low logic level when they are the same. The comparison of the lowest four digits (e.g., the outputs of XORs 558a-d) of the threshold and count are supplied to NOR gate 562a, while the highest four digits are supplied to NOR gate 562b. The NOR gates supply a high logical level only when all of the inputs to the NOR gate 562 are at a low logical level (e.g., each of the digits of ThreshHold and the count match each other). The output of the two NOR gates 562*a,b* are provided to the AND gate 564, which provides RHR at a high logical when both inputs are at a high logical level, and provides RHR at a low logical level otherwise.

In this manner, RHR is provided at a high logical level when the value of each of the flip-flop circuits 554*a-h* matches the value of the corresponding bit of the Threshold signal (e.g., when the count equals the value of the threshold). RHR transitioning to a high logical level may feedback (through inverter 566) to prevent the counter circuit from being responsive to further activations of ActivateCmd. Thus, once the count matches the value of the threshold, RHR may be provided at a high logic level until the signal StealFinished is provided to reset the counter circuit.

Figure 6:
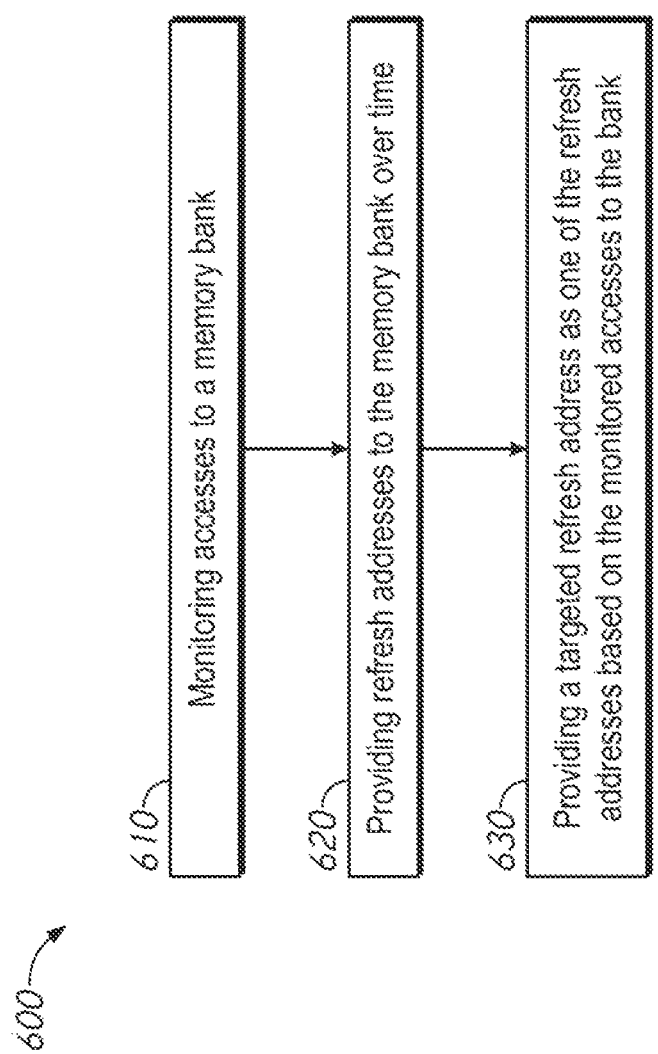
FIG. 6 is a flow chart depicting a method of refreshing a memory according to an embodiment of the present disclosure.

FIG. 6 is a flow chart depicting a method of refreshing a memory according to an embodiment of the present disclosure. In some embodiments, the method 600 may be implemented using the device 100 of FIG. 1. Although the method 600 may be described with respect to certain steps in a certain order, it should be appreciated that more or fewer steps may be used, certain steps may be repeated, and/or the steps may be used in a different order.

The method 600 may generally begin with block 610, which describes monitoring accesses to a memory bank. The memory bank may be part of a memory array (e.g., memory array 118 of FIG. 1) of a semiconductor memory device. The accesses may be any operation which requires activation of specific memory locations within memory bank (e.g., read commands and/or write commands). The accesses may be associated with access commands (e.g., bank addresses, activation of the memory bank, etc.) and the monitoring may involve counting a number and/or rate of the access commands.

In some embodiments, there may be a plurality of memory banks associated with the memory array, and the accesses may be monitored on a bank-by-bank basis. In some embodiments, the access commands to a given memory bank may be counted in a counter circuit. In some embodiments, where the rate of access command to the memory bank is monitored, a counter may be incremented each time an access command is received, and decremented at a frequency. If the value of the counter exceeds a threshold, it may indicate that access commands are received at or above a certain rate, and a targeted refresh command may be provided.

Block 610 may generally be followed by 620, which describes providing refresh addresses to the memory bank over time. In some embodiments, monitoring the accesses and providing the refresh addresses (e.g., blocks 610 and 620) may generally happen simultaneously. The refresh addresses may be directed to specific addresses within the memory bank. Responsive to the refresh addresses, corresponding rows in the memory bank may be refreshed.

Block 620 may generally be followed by block 630, which describes providing a targeted refresh address as one of the refresh addresses based on the monitored accesses to the bank. The refresh addresses may generally be either auto-refresh addresses or targeted refresh addresses. The auto-refresh address may be one (or more) of a sequence of addresses of the memory. The targeted refresh addresses may be specific addresses of the memory bank that have been identified as requiring more frequent refresh operations.

In some embodiments, the method 600 may include generating the targeted refresh address. Accesses to addresses of the memory bank may be monitored. It may be determined if a given row of the memory bank is an aggressor row. The aggressor row may be determined based on a certain pattern (e.g., frequency, number, etc.) of accesses to the aggressor row. One or more victim rows may be determined based on the aggressor row. The victim rows may undergo increased data degradation due to their relationship with the aggressor row. In some embodiments, the aggressor row may be a row hammer row, and the victim rows may be physically adjacent to the aggressor row. The address of the victim row(s) may be provided as the targeted refresh address.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
 a memory bank comprising word lines;
 a row decoder configured to access a word line of the memory bank based on a received access address, and to refresh a word line of the memory bank based on a received refresh address;
 an auto-refresh address generator configured to provide an auto-refresh address;
 a targeted refresh address generator configured to provide a targeted refresh address; and
 a cycle generator configured to determine if the auto-refresh address or the targeted refresh address is provided to the memory bank as the refresh address based on a count of the accesses to the memory bank.

2. The apparatus of claim 1, wherein the targeted refresh address generator is further configured to determine an aggressor address based on the received access addresses, determine a victim address based on the aggressor address, and provide the victim address as the targeted refresh address.

3. The apparatus of claim 1, further comprising a plurality of memory banks and a corresponding plurality of row decoders.

4. The apparatus of claim 3, wherein the cycle generator comprises a plurality of counters, each associated with one of the plurality of memory banks, wherein each of the counters is configured to count the received access addresses of the row decoder associated with the memory bank.

5. The apparatus of claim 3, further comprising a plurality of cycle generators, wherein each of the plurality of cycle generators is positioned in an associated one of the memory banks.

6. The apparatus of claim 1, wherein the the refresh address is provided responsive to a timing signal and wherein the cycle generator is configured to determine that a targeted refresh address is provided only during certain activations of the timing signal.

7. The apparatus of claim 1, wherein the auto-refresh addresses are periodically provided responsive to a timing signal, and wherein the targeted refresh address is provided instead of one of the auto-refresh address responsive to the count being equal to or greater than a threshold value.

* * * * *